United States Patent [19]

Baraona et al.

[11] Patent Number: 4,478,879
[45] Date of Patent: Oct. 23, 1984

[54] SCREEN PRINTED INTERDIGITATED BACK CONTACT SOLAR CELL

[75] Inventors: Cosmo R. Baraona, Parma; George A. Mazaris, Brookpark; An-ti Chai, North Ridgeville, all of Ohio

[73] Assignee: The United States of America as represented by the Administrator of the National Aeronautics and Space Administration, Washington, D.C.

[21] Appl. No.: 465,364

[22] Filed: Feb. 10, 1983

[51] Int. Cl.³ .............................................. B05D 5/12
[52] U.S. Cl. ...................................... 427/85; 136/256
[58] Field of Search .......................... 427/85; 136/256

[56] References Cited

U.S. PATENT DOCUMENTS 2,780,765  2/1961  Chappin et al. ........................ 320/2
2,999,240  9/1961  Nicoll .................................... 136/89
4,133,698  1/1979  Chiang et al. .................... 136/89 SJ
4,219,448  8/1980  Ross .................................. 136/256

FOREIGN PATENT DOCUMENTS 2550  6/1979  European Pat. Off. ................ 427/8

Primary Examiner—John H. Newsome
Attorney, Agent, or Firm—Norman T. Musial; John R. Manning; Gene E. Shook

[57] ABSTRACT

Interdigitated back contact solar cells are made by screen printing dopant materials onto the back surface of a semiconductor substrate in a pair of interdigitated patterns. These dopant materials are then diffused into the substrate to form junctions having configurations corresponding to these patterns. Contacts having configurations which match the patterns are then applied over the junctions.

3 Claims, 4 Drawing Figures

SCREEN PRINTED INTERDIGITATED BACK CONTACT SOLAR CELL

ORIGIN OF THE INVENTION

The invention described herein was made by employees of the United States Government and may be manufactured or used by or for the Government without the payment of any royalties thereon or therefor.

TECHNICAL FIELD

This invention is concerned with improved solar cells. The invention is particularly directed to the fabrication of interdigitated back contact solar cells on semiconductor substrates using screen printing techniques.

Prior art processes for fabricating interdigitated back contact cells utilize photolithographic methods to define the back contact patterns. The disadvantages of these processes are that they are more costly and complex, while being less easily automatable and controllable.

BACKGROUND ART

Chiang et al U.S. Pat. No. 4,133,698 is directed to a tandem junction solar cell having a P-type monocrystalline silicon substrate. The illuminated front surface is textured while an interdigitated P-N junction is located on the nonilluminated back surface. An unconnected front junction forms a "floating" junction which suppresses front surface recombination and enhances collection at the back side junction. A metallized back surface contact has a geometry which matches that of the P-N junction.

Nicoll U.S. Pat. No. 2,999,240 is concerned with photovoltaic cells of sintered materials. The cells have interdigitated electrodes of copper and silver pastes.

Evans et al U.S. Pat. No. 4,104,091 describes the use of screen printing to apply diffusants onto both surfaces of a semiconductor solar cell. One type of dopant is applied to the front surface of the substrate by this technique. An opposite type of dopant is applied to the back surface.

DISCLOSURE OF INVENTION

In accordance with the present invention a semiconductor solar cell is provided that may have an antireflective coating on the front surface. The back surface has interdigitated contacts with corresponding N and P patterns.

These solar cells are made by screen printing to define and fabricate the interdigitated back contact pattern. Doped pastes are used to diffuse dopants into the semiconductor substrate.

BRIEF DESCRIPTION OF THE DRAWING

The details of the invention will be described in connection with the accompanying drawings in which.

BEST MODE FOR CARRYING OUT THE INVENTION

Figure 3:
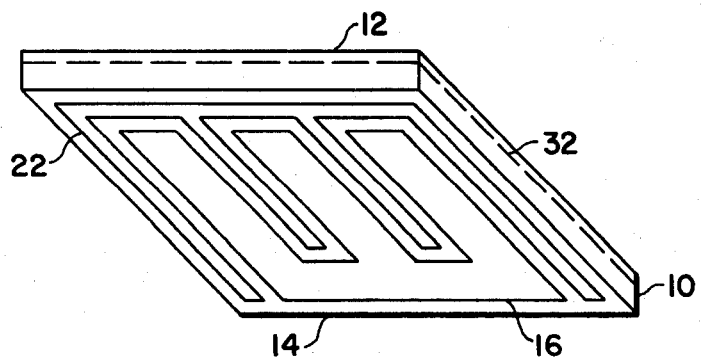
FIG. 3 is a perspective view illustrating the back surface of a solar cell having n and p+ type materials screen printed thereon in the patterns shown in FIGS. 1 and 2.

Referring now to the drawings there is shown in FIG. 3 a semiconductor substrate 10 in the shape of a wafer or a suitable rectangular parallelpiped block. Other shapes, such as hexagonal and circular, are also satisfactory.

By way of illustration the semiconductor substrate wafer 10 may comprise a single crystal silicon doped to a resistivity suitable for photovoltaic energy conversion. Resistivities between 0.1 and 100 ohm centimeters are satisfactory for silicon. The substrate wafer 10 has a thickness between about 5 $\mu$m and about 500 $\mu$m. The single crystal silicon substrate is doped with elements from group III-A of the periodic table including boron and aluminum.

The wafer 10 has a front surface 12 and a back surface 14. The front surface 12 is the illuminated surface. The desired finish is obtained for each surface 12 and 14 by lapping, polishing, or etching techniques that are well known in the art. The front surface 12 may be textured to reduce optical reflection.

Figure 1:
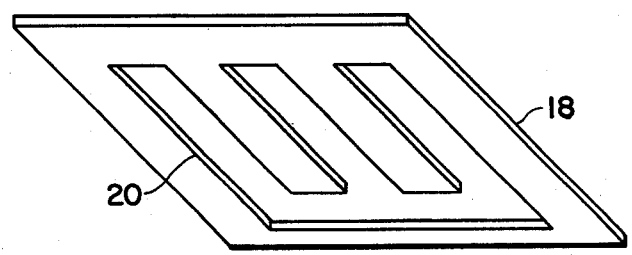
FIG. 1 is a perspective view of a screen used to print n-type material to a semiconductor wafer.

When the wafer 10 is of a p-type substrate material an n-type pattern 16 is applied to the back surface 14 using screen printing techniques. More particularly, a screen 18 shown in FIG. 1 is used. A pattern opening 20 having the proper configuration is formed in a screen 18 by a photolithographic method well known in the art.

The screen 18 may be emulsion coated stainless steel, silk, or some other material commonly used. The shape of the pattern 16 is arranged to enable a mating or complimentary p+ pattern 22 to be in close proximity to the n-type pattern 16. The spacing between the patterns 16 and 22 is uniform at various points along the mating portions of their respective configurations. This spacing is preferably about one mil.

Various configurations may be used for the n and p+ patterns. By way of example, these patterns can have a configuration of interlocking spirals, branching tree-like shapes, interdigitated comb-like patterns, or some other pair of mating shapes that provide for the close proximity of the n and p+ lines.

A screen printable n-type material of the type disclosed in U.S. Pat. No. 4,104,091 is applied to the screen 18 and printed. This duplicates the pattern 20 on the substrate 10.

This n-type paste on the substrate 10 is then dried and fired by heating to an elevated temperature thereby diffusing the n-type dopant into the substrate 10. This forms a p-n junction in the same configuration as the pattern opening 20 in the screen 18.

Figure 2:
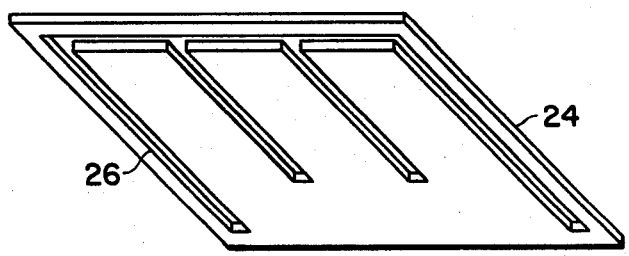
FIG. 2 is a perspective view of a screen used to print p+-type material to a semiconductor wafer.

In a similar fashion, a screen printable p+-type dopant, such as fine aluminum powder, in a paste-like formulation is printed through a second screen 24 shown in FIG. 2. The screen 24 has a pattern opening 26 which forms the mating pattern 22 with the n-type pattern 16 already on the substrate 10.

The p+-type dopant paste on the substrate is then dried and fired by again heating the coated substrate to an elevated temperature. This forms a p-p+ junction. While in the preferred embodiment the p+-type dopant in the pattern 22 is dried and fired after the n-type dopant in the pattern 16 is dried and fired, it is contemplated that in certain applications both dopants may be dried and fired simultaneously.

It will be apparent that the screens 18 and 24 must be properly indexed during the respective screen printing operations so that the uniform spacing between the patterns 16 and 22 are maintained. Alignment of the patterns is assured by the use of indexing pins or marks to position the screens 18 and 24 relative to the substrate 10. It is further important that the ratio between the areas of the screen openings 20 and 26 be about eight to one.

Metal contacts 28 and 30 are then applied to the back n and p+ patterns by screen printing in a similar manner. An antireflection coating may be similarly applied to the front illuminated surface 12 by screen printing. If desired, vacuum evaporation or plating techniques that are well known in the art may be used to apply the metal contacts and the antireflection coating.

Figure 4:
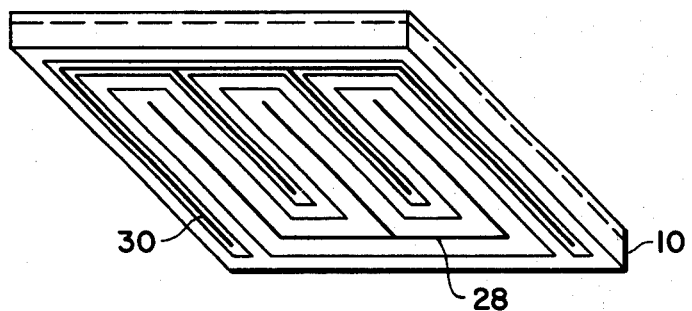
FIG. 4 is a perspective view illustrating the back surface of the solar shown in FIG. 3 with interdigitated back contacts attached.

The resulting structure is an interdigitated back contact solar cell as shown in FIG. 4. This solar cell has n and p+-patterns produced by screen printing.

DESCRIPTION OF ALTERNATE EMBODIMENT

A wafer 10 with a p-type substrate may have an n-type surface region 32 adjacent to the illuminated surface 12 as shown in FIG. 3. This layer reduces the surface-recombination velocity of the minority carriers. Such an embodiment is referred to as a tandem junction cell. A p+type surface region in a p-type substrate is referred to as a front surface field cell. These regions could be made by gaseous diffusion, spin-on, or print-on methods well known in the art.

While several embodiments of the invention have been disclosed and described, it will be appreciated that various modifications may be made to the disclosed structure and process without departing from the spirit of the invention or the scope of the subjoined claims. By way of example, an n-type substrate 10 might be used with screen printed n+ and p interdigitated patterns 16 and 22 on the back surface 14. The front illuminated surface 12 could comprise a substrate material itself, or an n+- or p- type layer to reduce surface recombination velocity. Texturing and antireflection coatings to reduce optical reflection also may be used in the alternate embodiment.

We claim:

1. In a method of making an interdigitated back contact solar cell of the type having both a first junction and a second junction adjacent to the nonilluminated back surface of a semiconductor substrate in a pair of interdigitated patterns with a uniform spacing therebetween, the improvement comprising forming an opening having a predetermined area in a first screen, said opening having a configuration corresponding to one of said patterns, positioning said first screen adjacent to said back surface of said substrate, screen printing one type of dopant material onto said back surface of said substrate in said first configuration and diffusing the same into said substrate, forming another opening having another area in a second screen, said other opening having another configuration corresponding to the other of said patterns, the ratio of said predetermined area of the opening in the first screen to said other area of the opening in the second screen being about eight to one, positioning said second screen adjacent to said back surface of said substrate so that said other pattern is uniformly spaced from said one pattern a distance of about one mil, and screen printing an opposite type of dopant material on said back surface in said other configuration and diffusing the same onto said substrate.

2. A method of making an interdigitated back contact solar cell as claimed in claim 1 wherein the dopant materials are screen printed sequentially and diffused sequentially.

3. A method of making an interdigitated back contact solar cell as claimed in claim 1 wherein the dopant materials are screen printed sequentially and diffused simultaneously.

* * * * *